US012777710B2

(12) United States Patent
Lv et al.

(10) Patent No.: US 12,777,710 B2
(45) Date of Patent: Oct. 27, 2026

(54) SEMICONDUCTOR DEVICE STRUCTURE AND MANUFACTURING METHOD THEREOF

(71) Applicant: Silergy Semiconductor Technology (Hangzhou) LTD, Hangzhou (CN)

(72) Inventors: Zheng Lv, Hangzhou (CN); Xunyi Song, Hangzhou (CN); Chihsen Huang, Hangzhou (CN)

(73) Assignee: Semiconductor Technology (Hangzhou) LTD., Hangzhou (CN)

( * ) Notice: Subject to any disclaimer, the term of this patent is extended or adjusted under 35 U.S.C. 154(b) by 501 days.

(21) Appl. No.: 18/205,090

(22) Filed: Jun. 2, 2023

(65) Prior Publication Data

US 2024/0014213 A1 Jan. 11, 2024

(30) Foreign Application Priority Data

Jul. 5, 2022 (CN) ........................ 202210789376.X

(51) Int. Cl.
*H10D 64/01* (2025.01)
*H10D 30/01* (2025.01)
(Continued)

(52) U.S. Cl.
CPC ........... *H10D 84/856* (2025.01); *H10D 64/01* (2025.01); *H10D 64/514* (2025.01);
(Continued)

(58) Field of Classification Search
CPC .... H10D 84/856; H10D 64/01; H10D 64/514; H10D 64/518; H10D 84/0179;
(Continued)

(56) References Cited

U.S. PATENT DOCUMENTS 4,436,584 A * 3/1984 Bernacki ........... H01L 21/02118 438/720
5,158,463 A 10/1992 Kim et al.
(Continued)

FOREIGN PATENT DOCUMENTS

CN 102184871 A * 9/2011
CN 109585376 A * 4/2019 ........... H01L 21/266
(Continued)

OTHER PUBLICATIONS

English translation of "CN 102184871 A" Liu et al, "Manufacturing Method for High-voltage Transversal Double Diffusion NMOS Based on Standard CMOS Technique", Sep. 14, 2011 (Year: 2011).*
(Continued)

*Primary Examiner* — Mounir S Amer
*Assistant Examiner* — Nicholas B Michaud

(57) ABSTRACT

A method of manufacturing a semiconductor device structure can include: forming a first gate dielectric layer on a first region of a semiconductor substrate, and forming a second gate dielectric layer on a second region of the semiconductor substrate; forming a conductive layer on the first and second gate dielectric layers; forming a barrier layer on the conductive layer; patterning the barrier layer to form a barrier pattern; etching the conductive layer to form first and second gates using the barrier pattern as a mask; forming a photolithography pattern on the semiconductor substrate, where the photolithography pattern exposes the well implantation area of the first region and a portion of the barrier pattern on the first gate; forming a well region in the well implantation area using the lithography pattern and the exposed barrier pattern as masks; and removing the photolithography pattern and the barrier pattern.

15 Claims, 7 Drawing Sheets

(51) Int. Cl.

| | |
|---|---|
| ***H10D 64/27*** | (2025.01) |
| ***H10D 84/01*** | (2026.01) |
| ***H10D 84/03*** | (2025.01) |
| ***H10D 84/85*** | (2025.01) |
| ***H10P 50/00*** | (2026.01) |
| ***H10P 50/26*** | (2026.01) |
| ***H10P 76/40*** | (2026.01) |

(52) U.S. Cl.
CPC ....... *H10D 64/518* (2025.01); *H10D 84/0179* (2025.01); *H10D 84/0181* (2025.01); *H10D 84/038* (2025.01); *H10P 50/268* (2026.01); *H10P 50/71* (2026.01); *H10P 76/405* (2026.01); *H10P 76/4085* (2026.01); *H10D 30/0281* (2025.01)

(58) Field of Classification Search
CPC ............. H10D 84/0181; H10D 84/038; H10D 30/0281; H10D 30/0221; H10D 84/83; H10D 84/0128; H10D 84/0144; H10D 84/0142; H10D 84/0135; H10D 64/512; H10D 64/517; H01L 21/0332; H01L 21/0337; H01L 21/32137; H01L 21/32139; H01L 21/31122; H01L 21/31144; H01L 21/266
USPC .......................................................... 257/288
See application file for complete search history.

(56) References Cited

U.S. PATENT DOCUMENTS

| | | | | |
|---|---|---|---|---|
| 5,933,731 | A | 8/1999 | Tanimoto et al. | |
| 7,018,899 | B2 | 3/2006 | Sung | |
| 7,074,659 | B2 | 7/2006 | Zuniga et al. | |
| 7,230,302 | B2 | 6/2007 | Lotfi et al. | |
| 7,372,104 | B2 | 5/2008 | Wu et al. | |
| 7,521,304 | B1 * | 4/2009 | Huang | H01L 21/28123 438/585 |
| 7,888,222 | B2 | 2/2011 | You et al. | |
| 7,981,739 | B1 | 7/2011 | You et al. | |
| 7,999,318 | B2 | 8/2011 | Zuniga et al. | |
| 8,063,444 | B2 | 11/2011 | Chang | |
| 8,119,507 | B2 | 2/2012 | You | |
| 8,293,612 | B2 | 10/2012 | Lee | |
| 8,319,283 | B2 | 11/2012 | Min et al. | |
| 8,431,450 | B1 | 4/2013 | Zuniga et al. | |
| 8,455,340 | B2 | 6/2013 | Zuniga et al. | |
| 8,574,973 | B1 | 11/2013 | You et al. | |
| 8,581,344 | B2 | 11/2013 | Liu | |
| 8,716,790 | B2 | 5/2014 | Lotfi et al. | |
| 8,716,795 | B2 | 5/2014 | You | |
| 8,912,600 | B2 | 12/2014 | You | |
| 10,262,997 | B2 | 4/2019 | Lin et al. | |
| 2005/0073007 | A1 | 4/2005 | Chen et al. | |
| 2006/0006462 | A1 | 1/2006 | Chang et al. | |
| 2007/0148885 | A1 * | 6/2007 | Kim | H01L 21/28035 438/299 |
| 2007/0200179 | A1 * | 8/2007 | Chen | H10D 30/792 438/300 |
| 2010/0052052 | A1 | 3/2010 | Lotfi et al. | |
| 2013/0200453 | A1 | 8/2013 | Park | |
| 2014/0001549 | A1 | 1/2014 | Bode et al. | |
| 2014/0320174 | A1 | 10/2014 | Lu et al. | |
| 2015/0235864 | A1 * | 8/2015 | Vogt | H01L 21/31155 438/694 |
| 2017/0018430 | A1 * | 1/2017 | Peng | H01L 21/28052 |
| 2017/0179279 | A1 | 6/2017 | Lin et al. | |
| 2018/0174887 | A1 | 6/2018 | Chuang | |
| 2019/0081045 | A1 | 3/2019 | Lin et al. | |

FOREIGN PATENT DOCUMENTS

| | | | |
|---|---|---|---|
| KR | 1020070063317 | A | 6/2007 |
| TW | I523233 | B | 2/2016 |

OTHER PUBLICATIONS

English translation of "CN 109585376 A" Zhao et al, "Semiconductor Device and Its Doping Method", Apr. 5, 2019 (Year: 2019).*

* cited by examiner

SEMICONDUCTOR DEVICE STRUCTURE AND MANUFACTURING METHOD THEREOF

RELATED APPLICATIONS

This application claims the benefit of Chinese Patent Application No. 202210789376.X, filed on Jul. 5, 2022, which is incorporated herein by reference in its entirety.

FIELD OF THE INVENTION

The present invention generally relates to the field of semiconductors, and in particular to integrated circuitry and manufacturing methods thereof.

BACKGROUND

With the continued development of power integrated circuits, increasingly advanced integration and high-density CMOS devices need to be made. A power integrated circuit can integrate CMOS devices from a micrometer level to deep submicron and nanoscale levels. The gate of high-voltage or high-power devices in the power part of power integrated circuits may remain essentially unchanged in size due to their performance requirements, while the gate of the high-density CMOS devices in the control portion may require thinning as the integration level evolves. The unity of these two becomes increasingly difficult or complex in power integrated circuits manufacturing processes.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

In existing manufacturing methods of integrated power devices and high-density devices, the power devices generally have stringent restrictions on the line width of high-density devices, which can reach the deep submicron level, and it may be difficult to achieve the nanometer level. Moreover, the gate of the power devices, the gate of the high-density devices may not be formed at the same time, and the process can be relatively complicated and expensive.

Figure 1:
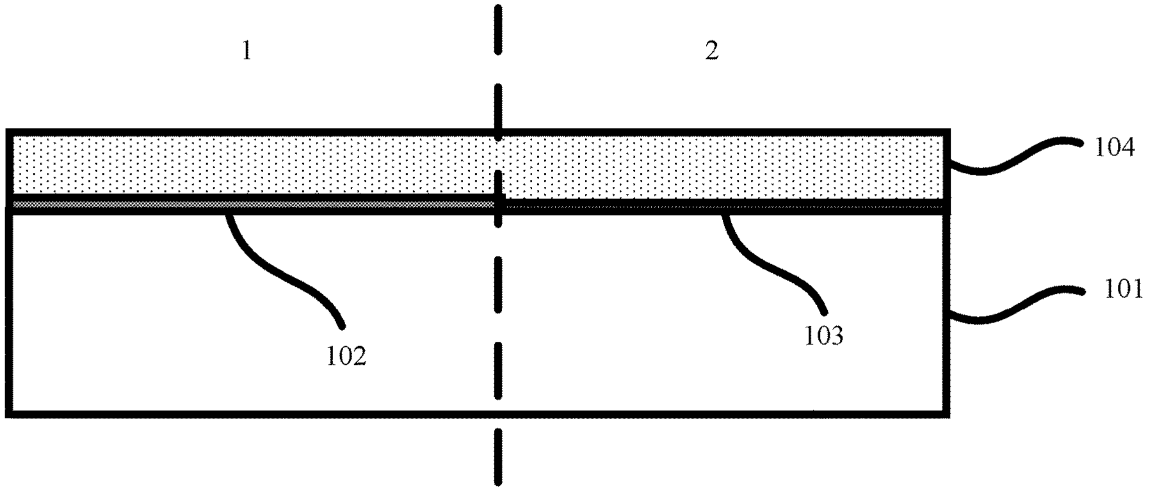
FIGS. 1 to 11 are structural diagrams of each step of an example method of manufacturing a semiconductor device structure, in accordance with embodiments of the present invention.

Referring now to FIGS. 1 to 11, shown are structural diagrams of each step of an example method of manufacturing a semiconductor device structure, in accordance with embodiments of the present invention. In FIG. 1, semiconductor substrate 101 can be provided. Also, gate dielectric layer 102 can be formed on a first region of semiconductor substrate 101, and gate dielectric layer 103 may be formed on a second region of semiconductor substrate 101. For example, a thickness of gate dielectric layer 102 can be greater than a thickness of gate dielectric layer 103. Semiconductor substrate 101 can include any suitable semiconductor material. For example, semiconductor substrate 101 can be silicon, germanium, germanium silicon, silicon-on-insulator (SOI), silicon carbide, gallium arsenide, or any other III-V compound semiconductors.

For example, a method of forming gate dielectric layer 102 and gate dielectric layer 103 on regions 1 and 2 of semiconductor substrate 101, respectively, can include forming gate dielectric layer 102 on semiconductor substrate 101. For example, a first oxide layer with a first thickness can be formed on semiconductor substrate 101 through oxidation processes (e.g., chemical oxidation, thermal oxidation, a combination of the two, etc.) as gate dielectric layer 102. For example, the first thickness can range from 20 angstroms to 100 angstroms, such as about 50 angstroms. In one example, the first oxide layer can be formed through a rapid thermal oxidation process. Gate dielectric layer 102 can be selectively removed on region 2, and gate dielectric layer 102 may be retained on region 1. For example, gate dielectric layer 102 on region 2 can be removed through a photolithography and etching process, and the etching process can be one of wet etching or dry etching processes.

Gate dielectric (e.g., oxide) layer 103 can be formed in region 2 of semiconductor substrate 101. For example, the thickness of gate dielectric layer 102 can be greater than the thickness of gate dielectric layer 103. In one example, oxide layer 103 with a second thickness can be formed in region 2 of semiconductor substrate 101 through a thermal oxidation process, and serving as gate dielectric layer 103. For example, the second thickness can range from 10 angstroms to 50 angstroms, such as about 30 angstroms. Here, during the thermal oxidation growth of oxide layer 103, oxygen atoms may still pass through the first oxide layer to reach the surface of semiconductor substrate 101, thus causing oxidation of a portion of the surface of semiconductor substrate 101 located below the first oxide layer, and again growing the first oxide layer. Due to the blocking effect of the first oxide layer, the growth rate of the first oxide layer can be slower than the growth rate of the second oxide layer. In one example, the thickness of the first oxide layer can increase to 60-70 angstroms due to the re-growth.

Of course, gate dielectric layer 102 and gate dielectric layer 103 can also be formed in other suitable ways in certain embodiments. In FIG. 1, conductive layer 104 can be formed on gate dielectric layer 102 and gate dielectric layer 103. In one example, the material of conductive layer 104 can be a semiconductor material, such as a polysilicon material, and which can be prepared by one of an electron beam evaporation (EBM) process, a chemical vapor deposition (CVD) process, and an atomic layer deposition (ALD) process. The thickness of conductive layer 104 can range from 1000 angstroms to 2500 angstroms, such as about 1500 angstroms.

Figure 2:
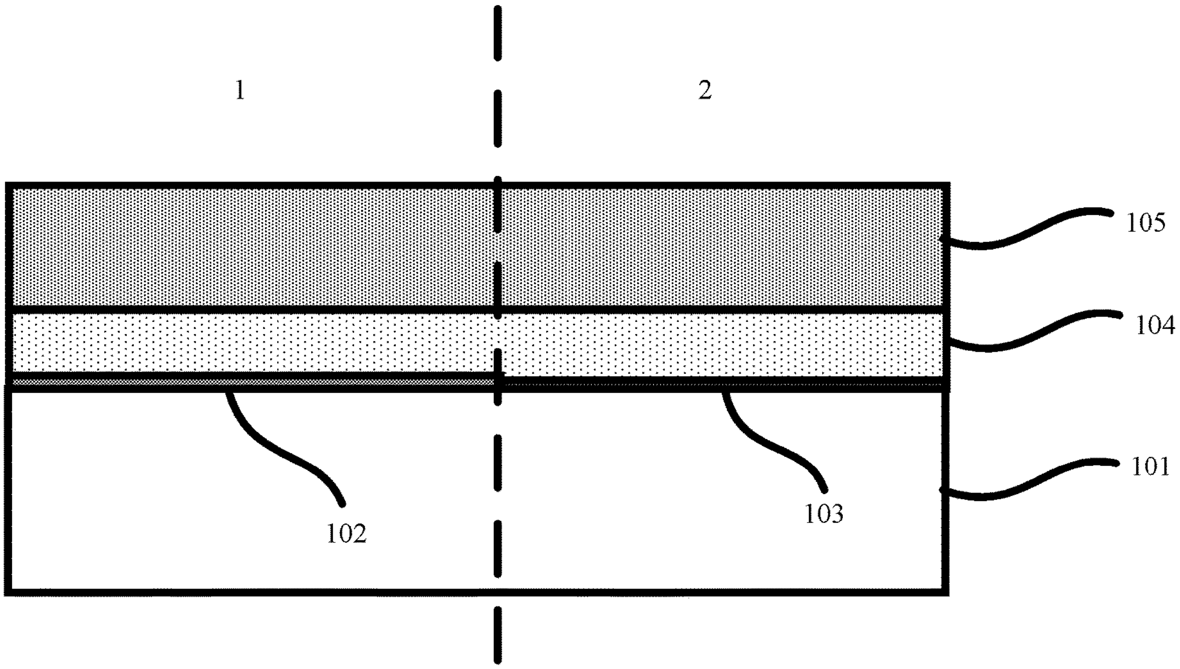

As shown in FIG. 2, barrier layer 105 can be formed on conductive layer 104. Barrier layer 105 may have a high etching selectivity relative to the conductive layer 104. In one example, barrier layer 105 can be an amorphous carbon barrier layer 105, which has a high etching selectivity relative to the polysilicon. Amorphous carbon barrier layer 105 can be formed on conductive layer 104 through an atomic layer deposition process, in order to accurately control the thickness of amorphous carbon barrier layer 105. Amorphous carbon barrier layer 105 can include one of diamond-like amorphous carbon, graphite-like amorphous carbon, and amorphous carbon between diamond-like and graphite-like.

In one example, the thickness of amorphous carbon barrier layer 105 can range from 2500 angstroms to 4000 angstroms. For example, the thickness of amorphous carbon barrier layer 105 can be negatively correlated with the thickness of conductive layer 104, and the total thickness of amorphous carbon barrier layer 105 and conductive layer 104 can range between 4500 angstroms and 5500 angstroms. In one example, the thickness of conductive layer 104 can be about 1000 angstroms, and the thickness of amorphous carbon barrier layer 105 can be about 4000 angstroms. Since amorphous carbon barrier layer 105 has a relatively high etching selectivity, this layer can play a stable mask role for subsequent etching of polysilicon.

Figure 3:
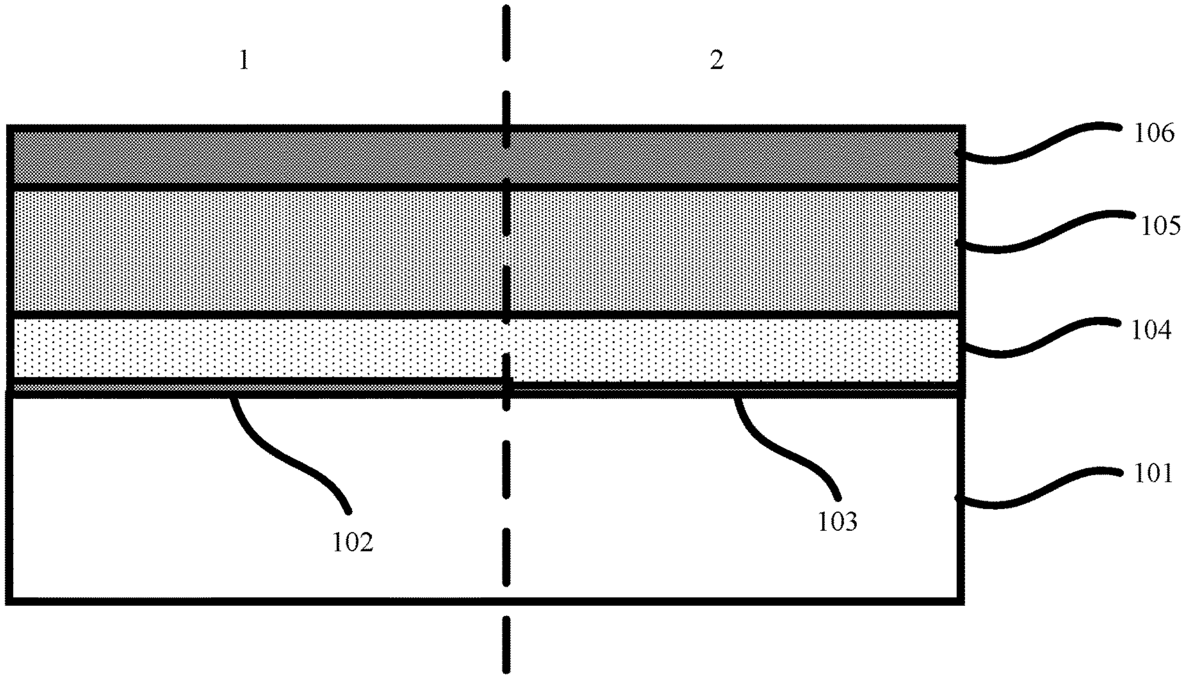
Figure 4:
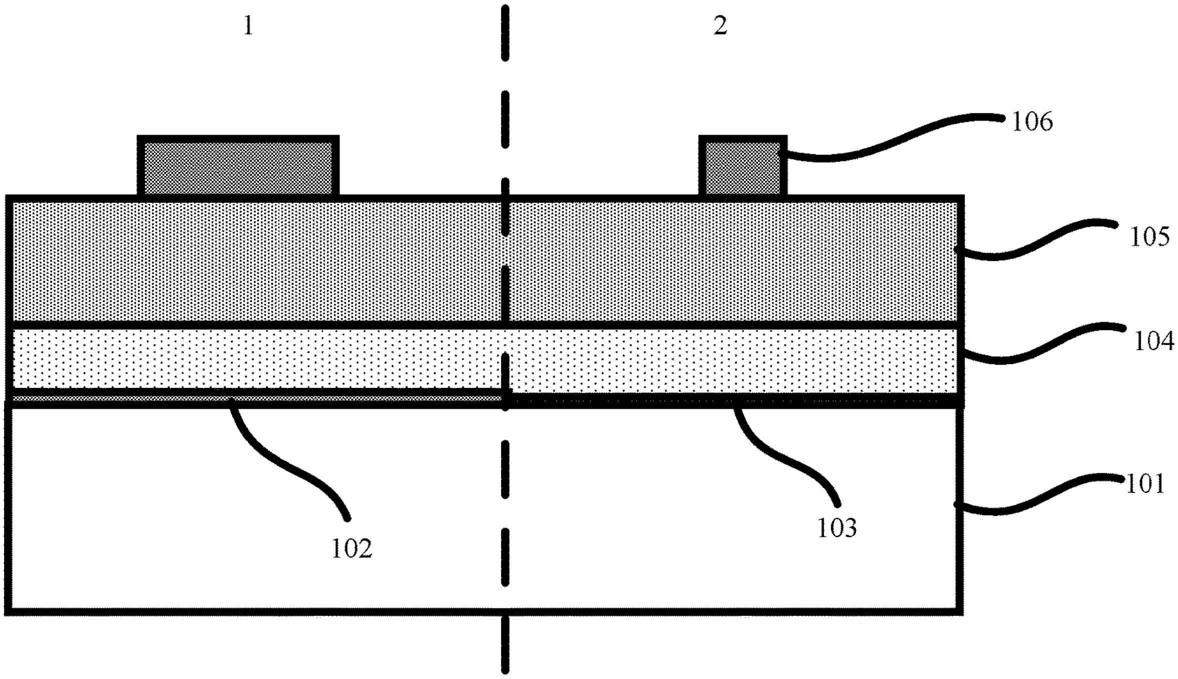
Figure 5:
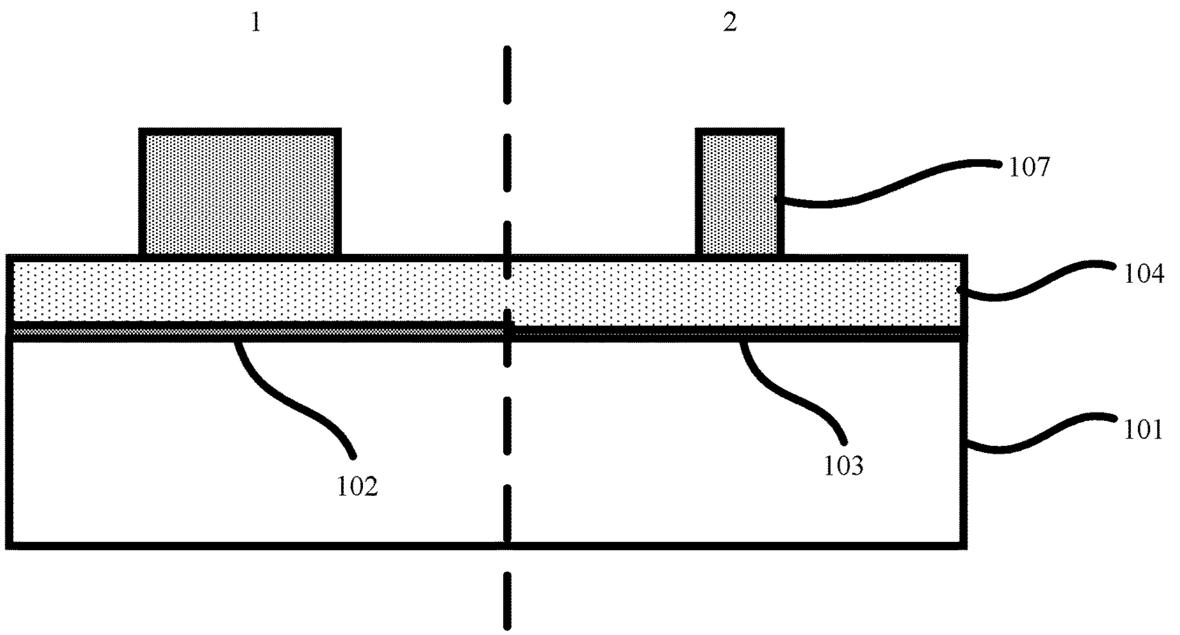

As shown in FIGS. 3-5, amorphous carbon barrier layer 105 can be patterned to form barrier pattern 107. In one example, the patterning of amorphous carbon barrier layer 105 to form barrier pattern 107 can include forming photoresist layer 106 on amorphous carbon barrier layer 105 by, e.g., a spin coating process. Also, photoresist layer 106 in FIG. 3 can be patterned by a photolithography process, and amorphous carbon barrier layer 105 can be etched based on patterned photoresist layer 106 in FIG. 4, in order to form barrier pattern 107.

In one embodiment, oxygen plasma can be used to etch amorphous carbon barrier layer 105 to form barrier pattern 107. In addition, by setting the thickness of photoresist layer 106, patterned photoresist layer 106 may be fully removed by the oxygen plasma when the etching process of amorphous carbon barrier layer 105 is completed. This can save subsequent removal steps of photoresist layer 106, which may reduce manufacturing costs. In one example, photoresist layer 106 can be set to a smaller thickness, such as a thickness less than or equal to 1500 angstroms, in order to improve the accuracy of the photoresist layer in the exposure and development process, thereby achieving a smaller feature size in region 2.

Figure 6:
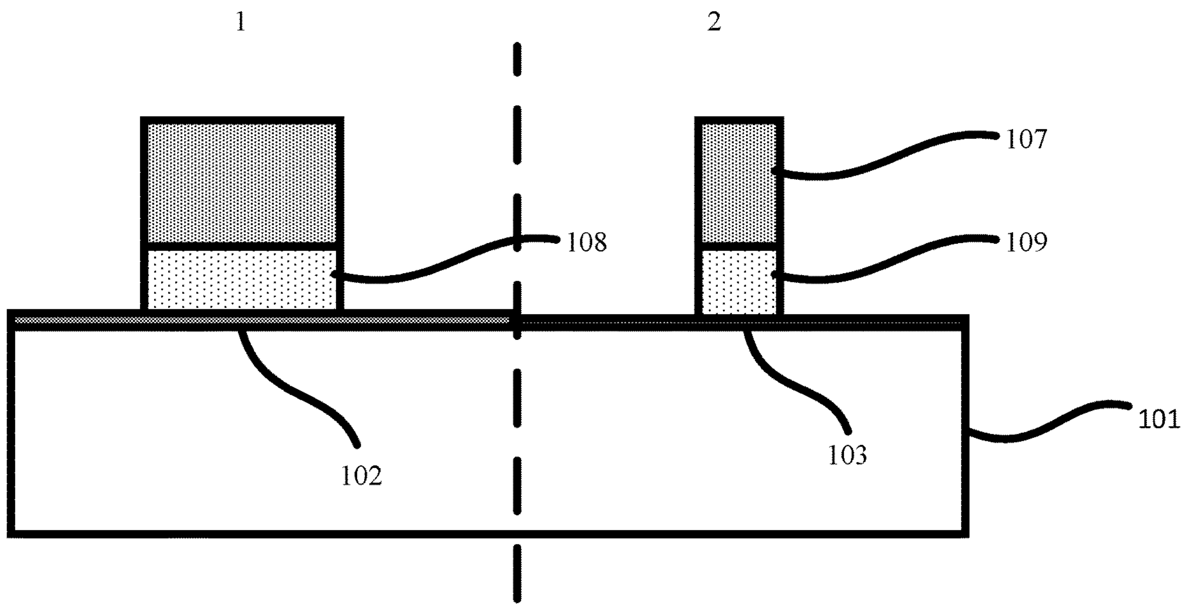

As shown in FIG. 6, conductive layer 104 can be etched based on barrier pattern 107, in order to form gates 108 and 109. In one example, the polysilicon layer can be etched by the reactive ion etching process, in order to form gates 108 and 109. Since amorphous carbon barrier layer 105 has a high etching selectivity relative to the polysilicon in the reactive ion etching process, amorphous carbon barrier layer 105 can play a stable mask role for the etching of polysilicon.

In one example, the width of gate 108 can be greater than the width of gate 109, and the width of gate 109 may be less than or equal to 90 nanometers (e.g., 90 nanometers, 65 nanometers, etc.). Gate 108 can be used to make high-power devices, such as laterally-diffused metal-oxide-semiconductor (LDMOS) field-effect transistors. Gate 109 can be used to manufacture high-density nanoscale CMOS devices and other intelligent devices.

Figure 7:
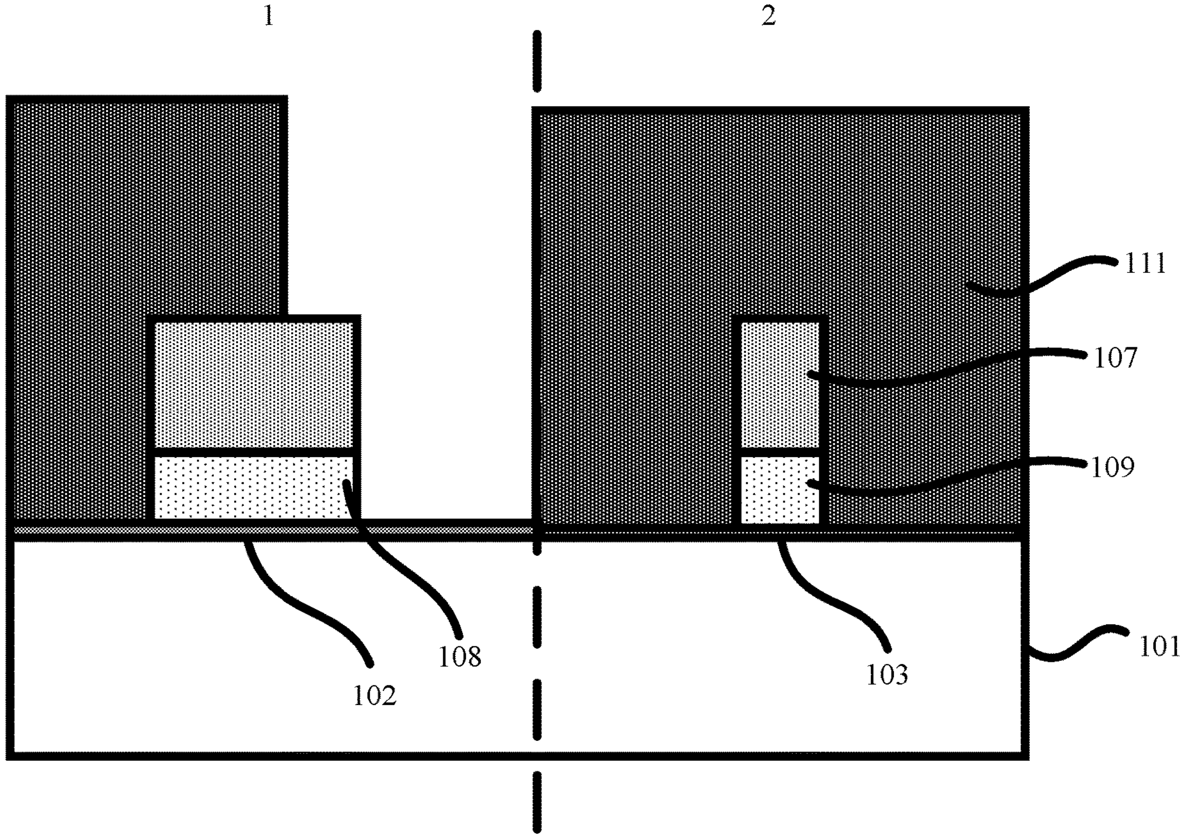

As shown in FIG. 7, photolithography pattern 111 can be formed on semiconductor substrate 101. Photolithography pattern 111 may have an implantation window that exposes the well implantation region of region 1, and a portion of barrier pattern 107 on gate 108. In the above ion implantation process, amorphous carbon barrier layer 105 can ensure that the implanted ions can be effectively blocked when the thickness of the gate polysilicon is suitably small, such that the ion dose implanted into semiconductor substrate 101 may be strictly controlled. This example can effectively improve the process window of the photolithography process, and one edge of the implantation window may only need to fall within the area of gate 108. For example, the implantation window can contain between 5% and 95% of the length of gate 108, thus greatly reducing the photolithography process requirements.

Figure 8:
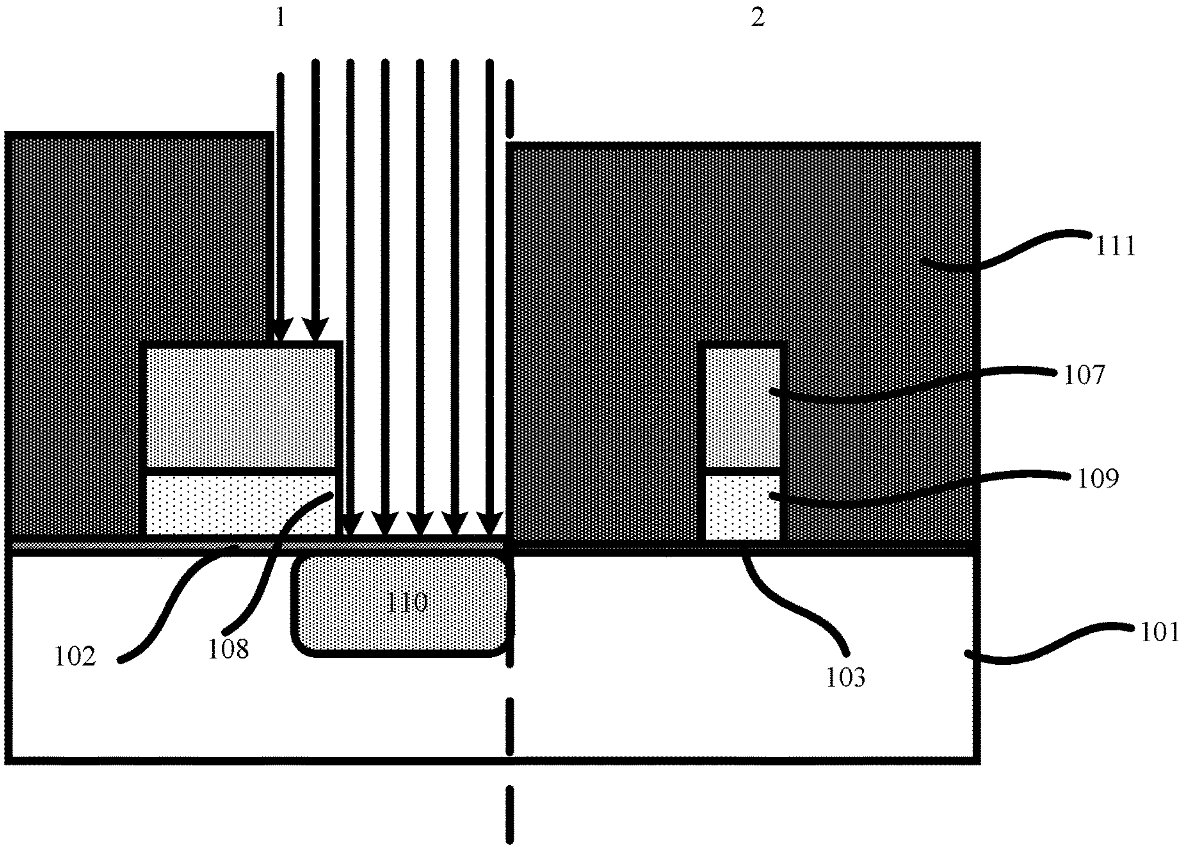

As shown in FIG. 8, photolithography pattern 111 and exposed barrier pattern 107 may be utilized as masks, and a large angle ion implantation process can form well region 110 in the well implantation area. During the ion implantation process, photolithography pattern 111, exposed barrier pattern 107, and gate 108 may serve as masks to effectively block the implanted ions, thereby accurately controlling the morphology of well region 110. In one example, well region 110 is a P-type conductive type, and the implanted ions can be, e.g., boron. After ion implantation, well region 110 may be pushed below gate 108 by an annealing process, in order to form a channel region.

Figure 9:
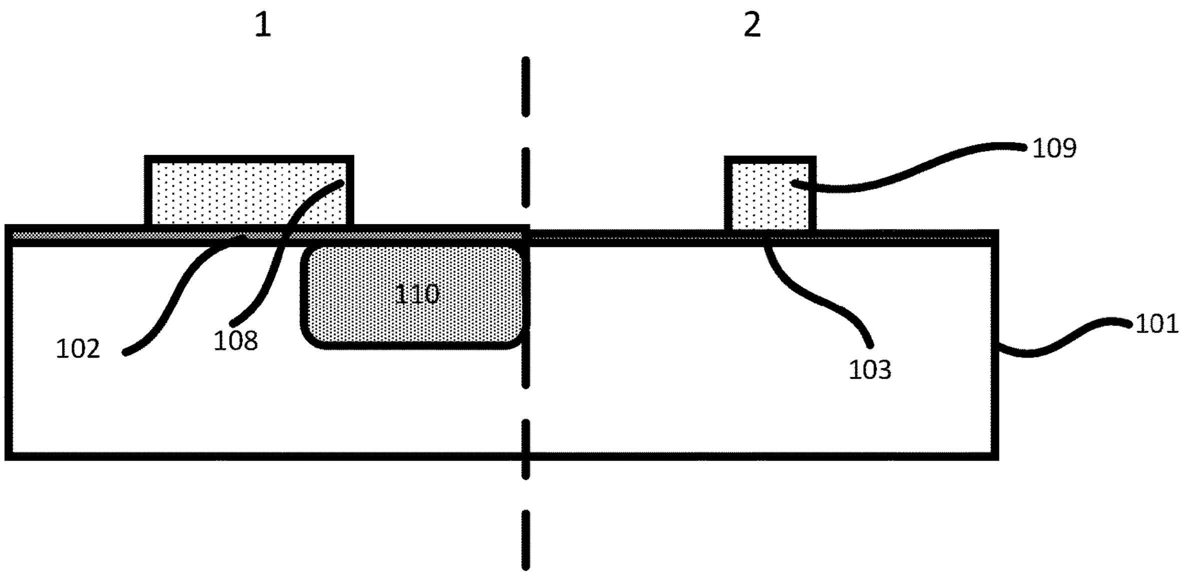
Figure 10:
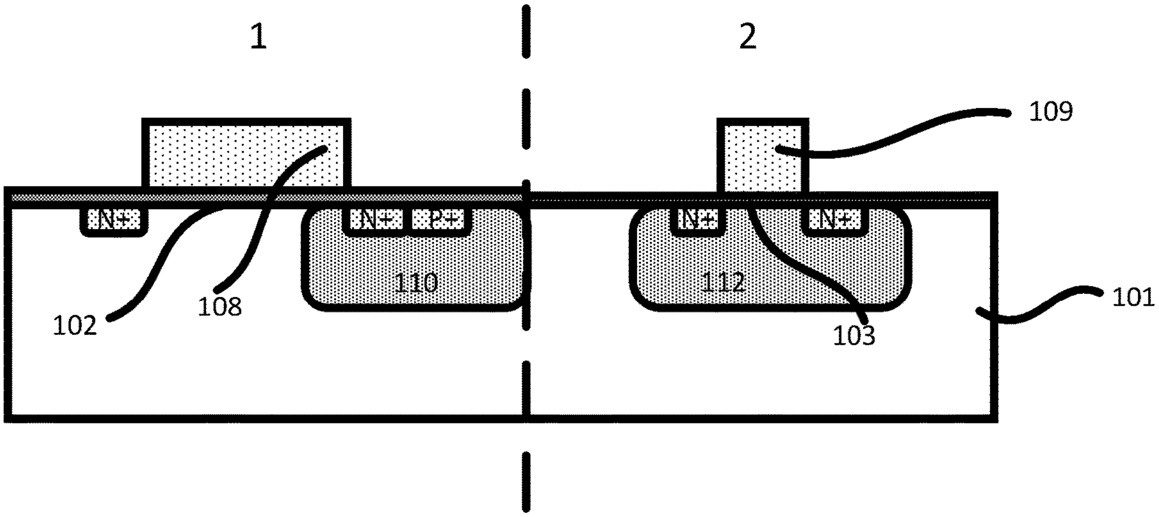
Figure 11:
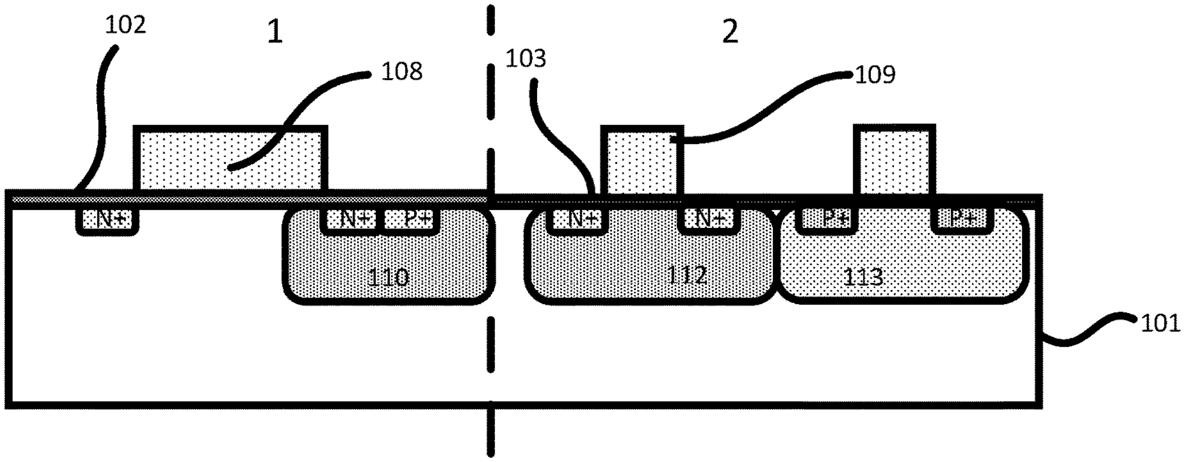

As shown in FIG. 9, photolithography pattern 111 and barrier pattern 107 can be removed. In one example, photolithography pattern 111 and barrier pattern 107 can be removed by a wet process or an oxygen plasma etching process. As shown in FIGS. 10 and 11, a power device can be formed in region 1 based on gate 108 and well region 110, and a high-density device formed in the region 2 based on gate 109. In one example, the power device can include a laterally-diffused metal-oxide-semiconductor field-effect transistor, and the high-density device can include a metal-oxide-semiconductor field-effect transistor used in, e.g., logic circuitry, microprocessor(s), and/or storage circuitry.

As shown in FIG. 10, the laterally-diffused metal-oxide-semiconductor field-effect transistor can include gate 108, well region 110, an N-type heavily doped source region (N+), an N-type heavily doped drain region (N+), and a P-type heavily doped contact region (P+). The N-type heavily doped source region and N-type heavily doped drain region can be located on both sides of gate 108, and well region 110 may extend below gate 108 to form a channel region. The high-density device can include an NMOS transistor, which can include P-well 112 located in semiconductor substrate 101, gate 109 and an N-type heavily doped source region (N+), and N-type heavily doped drain region (N+) located on both sides of gate 109.

As shown in FIG. 11, the high-density device in region 2 can also include a CMOS device having an NMOS transistor and a PMOS transistor. The PMOS transistor can be adjacent to the NMOS transistor, and the NMOS transistor may include P-well 112 located in semiconductor substrate 101, gate 109, and an N-type heavily doped source region (N+) and an N-type heavily doped drain region (N+) located on both sides of gate 109. The PMOS transistor can include N-well 113 located in semiconductor substrate 101, gate 109, and a P-type heavily doped source region (P+) and a P-type heavily doped drain region (P+) located on both sides of gate 109.

In particular embodiments, a method of manufacturing a semiconductor device structure can enable the selection of a barrier layer with a high etching selectivity relative to the conductive layer during device design, such that gates 108 and 109 of the first and second regions may be formed simultaneously. That is, the thickness of the polysilicon gate can be predetermined based on requirements of the high-density device. Also, self-aligned implantation of well 110 of the power device can be achieved at the same time, which can allow power devices to integrate high-density devices at the nanoscale. In particular embodiments, the manufacturing method can effectively simplify the process, reduce process costs, and improve manufacturing yield, as compared to conventional approaches.

As shown in FIGS. 10 and 11, a semiconductor device structure can be provided, and may include semiconductor substrate 101, a power device located in region 1 of semiconductor substrate 101, and a high-density device located in region 2 of semiconductor substrate 101. Among them, the power device and the high-density device may have gate structures having a same height. The gate structure of the power device can include gate dielectric layer 102 located on the surface of region 1 of semiconductor substrate 101, and gate 108 located on gate dielectric layer 102. The gate structure of the high-density device can include gate dielectric layer 103 located on the surface of region 2 of the semiconductor substrate, and a gate 109 located on gate dielectric layer 103, where gates 108 and 109 are synchronously or simultaneously formed.

In one example, the thickness of gate 108 can range from 1000 angstroms to 2500 angstroms, and the thickness of gate 109 can range from 1000 angstroms to 2500 angstroms. In one example, the width of the first gate can be greater than the width of the second gate, and the width of the second gate may be less than or equal to 90 nanometers. In one example, the power device can include a laterally-diffused metal-oxide-semiconductor field-effect transistor, and the high-density device can include a metal oxide semiconductor field-effect transistor used in, e.g., logic circuitry, microprocessor(s), and/or storage circuitry.

In FIG. 10, the laterally-diffused metal-oxide-semiconductor field-effect transistor can include gate 108, well region 110, an N-type heavily doped source region (N+), an N-type heavily doped drain region (N+), and a P-type heavily doped contact region (P+). The N-type heavily doped source region and N-type heavily doped drain region can be located on both sides of gate 108, and well region 110 may extend below gate 108 to form a channel region. The high-density device can include an NMOS transistor, which may include P-well 112 located in semiconductor substrate 101, gate 109, and an N-type heavily doped source region (N+) and N-type heavily doped drain region (N+) located on both sides of gate 109.

As shown in FIG. 11, the high-density device in region 2 can also include a CMOS device having an NMOS transistor and a PMOS transistor. The PMOS transistor can be adjacent to the NMOS transistor, and the NMOS transistor may include P-well 112 located in semiconductor substrate 101, gate 109, and an N-type heavily doped source region (N+) and an N-type heavily doped drain region (N+) located on both sides of gate 109. The PMOS transistor can include N-well 113 located in semiconductor substrate 101, gate 109, and a P-type heavily doped source region (P+) and a P-type heavily doped drain region (P+) located on both sides of gate 109.

Figure 12:
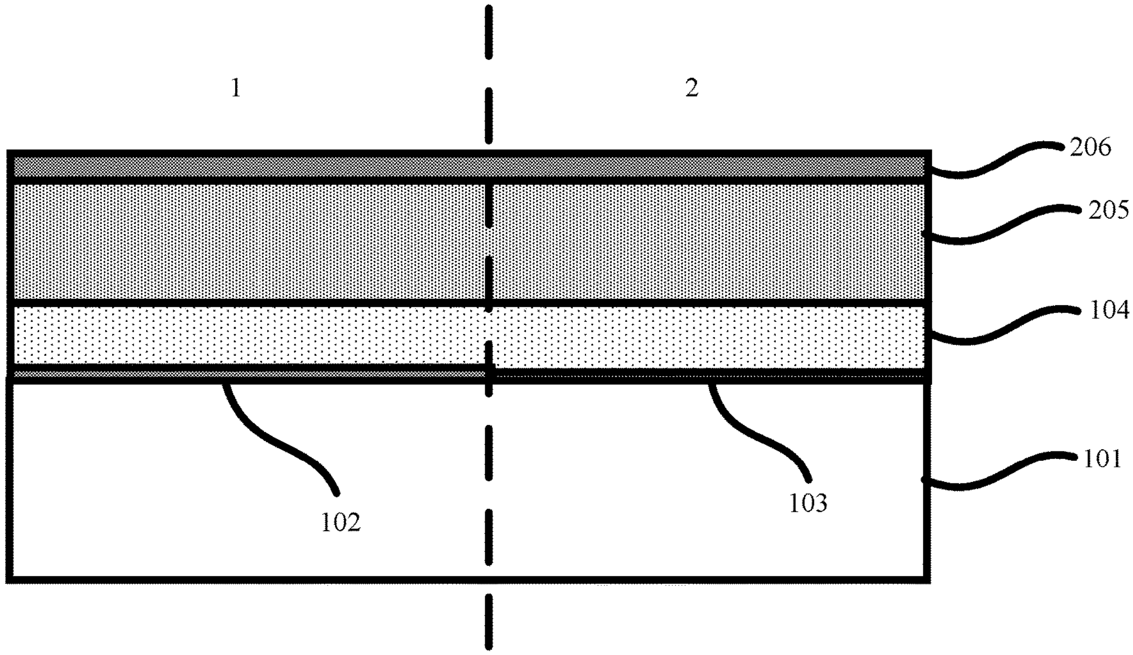
FIG. 12 is a structural diagram of an example semiconductor device structure, in accordance with embodiments of the present invention.

Referring now to FIG. 12, shown is a structural diagram of an example semiconductor device structure, in accordance with embodiments of the present invention. In this particular example, amorphous carbon barrier layer 205 can include a laminated structure having diamond-like amorphous carbon and graphite-like amorphous carbon, which are laminated once or alternately for many times. Further, after amorphous carbon barrier layer 205 is formed on conductive layer 104, the forming of anti-reflective layer 206 on the amorphous carbon barrier layer 205 can also be included. The anti-reflective layer can include oxides or nitrides (e.g., silicon oxide, silicon nitride, or the above two alternating layers) with a thickness of from 100 angstroms to 1500 angstroms. The anti-reflection layer can cover the surface of amorphous carbon barrier layer 205, in order to reduce the impact of reflection from amorphous carbon barrier layer 205 on the alignment in the photolithography process.

In particular embodiments, the semiconductor device structure and its manufacturing method may have the following beneficial effects. By setting an amorphous carbon barrier layer on the polysilicon gate, the particular embodiments can enable the amorphous carbon barrier layer and the polysilicon gate to act as the implantation barrier layer together when a well area of the power device with relatively large energy is required for ion implantation. Therefore, during device design, the gate of the power device and the gate of the high-density device can be formed at the same time. Also, the thickness of the polysilicon gate can be predetermined based on requirements of the high-density device, and self-aligned implantation of well 110 of the power device can be achieved at the same time. This can allow power devices to integrate high-density devices at nanoscale. In this way, the manufacturing method can effectively simplify the process, reduce process costs, and improve manufacturing yield, as compared to conventional approaches.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A method of manufacturing a semiconductor device structure, the method comprising:

a) forming a first gate dielectric layer on a first region of a semiconductor substrate, and forming a second gate dielectric layer on a second region of the semiconductor substrate, wherein a thickness of an entirety of the first gate dielectric layer is greater than a thickness of an entirety of the second gate dielectric layer;

b) forming a conductive layer on the first gate dielectric layer and the second gate dielectric layer;

c) forming a barrier layer on the conductive layer, wherein the barrier layer is configured as an amorphous carbon barrier layer, and wherein a thickness of the amorphous carbon barrier layer is negatively correlated with a thickness of the conductive layer;

d) patterning the barrier layer to form a barrier pattern;

e) etching the conductive layer to simultaneously form a first gate and a second gate by using the barrier pattern as a mask, wherein a width of the second gate is less than or equal to 90 nanometers and less than a width of the first gate;

f) forming a photolithography pattern on the semiconductor substrate, wherein the photolithography pattern has an implantation window that exposes a well implantation area of the first region and a portion of the barrier pattern on the first gate;

g) forming a well region in the well implantation area by an ion implantation process using the lithography pattern and the exposed barrier pattern as masks;

h) removing the photolithography pattern and the barrier pattern; and i) forming a power device in the first region based on the first gate and the first gate dielectric layer, and forming a high-density device in the second region based on the second gate and the second gate dielectric layer.

2. The method of claim 1, wherein the patterning the barrier layer to form a barrier pattern comprises:

a) forming a photoresist layer on the barrier layer;

b) patterning the photoresist layer to form a patterned photoresist layer; and c) etching the barrier layer to form the barrier pattern by using the patterned photoresist layer as a mask.

3. The method of claim 2, wherein the etching the barrier layer to form the barrier pattern comprises using an oxygen plasma process.

4. The method of claim 2, wherein by setting the thickness of the photoresist layer, the patterned photoresist layer is fully etched and removed when the etching process of the barrier layer is completed.

5. The method of claim 1, wherein the conductive layer comprises a polysilicon layer, and the conductive layer is etched by a reactive ion etching process to form a first gate and a second gate.

6. The method of claim 1, wherein the barrier layer has a high etching selectivity relative to the conductive layer.

7. The method of claim 1, wherein the barrier layer comprises an amorphous carbon barrier layer having at least one of diamond-like, graphite-like, or materials with properties ranging between diamond-like or graphite-like.

8. The method of claim 7, wherein the amorphous carbon barrier layer is formed on the conductive layer by an atomic layer deposition process.

9. The method of claim 7, wherein the amorphous carbon barrier layer is a laminated structure comprising diamond-like and graphite-like materials through one-time lamination or multiple times alternating lamination.

10. The method of claim 1, wherein a thickness of the conductive layer is in a range from 1000 angstroms to 2500 angstroms, and a thickness of the barrier layer is in a range from 2500 angstroms to 4000 angstroms.

11. The method of claim 1, further comprising, after the forming the barrier layer on the conductive layer, forming an anti-reflective layer on the barrier layer.

12. The method of claim 1, wherein the forming the first gate dielectric layer on the first region of the semiconductor substrate and the second gate dielectric layer on the second region of the semiconductor substrate comprises:

a) forming a first gate dielectric layer on the semiconductor substrate;

b) selectively removing the first gate dielectric layer on the second region and retaining the first gate dielectric layer on the first region;

c) forming a second gate dielectric layer in the second region of the semiconductor substrate; and d) wherein a thickness of the first gate dielectric layer is greater than a thickness of the second gate dielectric layer.

13. The method of claim 1, wherein the power device comprises a laterally-diffused metal-semiconductor field-effect transistor, and the high-density device comprises a metal-oxide-semiconductor field-effect transistor used in one of logic circuits, microprocessors, and storage circuits.

14. The method of claim 1, wherein forming the barrier pattern comprises:

a) forming a photoresist layer on the barrier layer;

b) patterning the photoresist layer to form a patterned photoresist layer; and c) using the patterned photoresist layer as a mask, etching the barrier layer to form the barrier pattern by oxygen plasma etching process, d) wherein a thickness of the photoresist layer is set such that the patterned photoresist layer is completely removed.

15. The method of claim 1, wherein a width of the first gate is greater than 90 nanometers.

* * * * *